(12) United States Patent
Kim et al.

(10) Patent No.: US 9,627,616 B2
(45) Date of Patent: Apr. 18, 2017

(54) ELECTRONIC DEVICE AND METHOD FOR FABRICATING THE SAME

(71) Applicant: SK hynix Inc., Icheon-Si (KR)

(72) Inventors: Sook-Joo Kim, Icheon-Si (KR);
Jae-Geun Oh, Icheon-Si (KR);
Keum-Bum Lee, Icheon-Si (KR);
Hyung-Suk Lee, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 25 days.

(21) Appl. No.: 14/225,354

(22) Filed: Mar. 25, 2014

(65) Prior Publication Data

US 2014/0287535 A1 Sep. 25, 2014

(30) Foreign Application Priority Data

Mar. 25, 2013 (KR) .................. 10-2013-0031611

(51) Int. Cl.
*H01L 21/00* (2006.01)
*H01L 45/00* (2006.01)
*H01L 43/12* (2006.01)

(52) U.S. Cl.
CPC .......... *H01L 45/1675* (2013.01); *H01L 43/12* (2013.01); *H01L 45/04* (2013.01); *H01L 45/06* (2013.01); *H01L 45/08* (2013.01); *H01L 45/1233* (2013.01)

(58) Field of Classification Search
CPC . H01L 45/1675; H01L 45/1233; H01L 43/12; H01L 45/06; H01L 45/08; H01L 45/04
See application file for complete search history.

(56) References Cited

U.S. PATENT DOCUMENTS

| 6,566,194 B1* | 5/2003 | Ramsbey | H01L 27/105 257/E21.645 |
| 2002/0134671 A1* | 9/2002 | Demaray | C23C 14/14 204/192.25 |
| 2002/0142530 A1* | 10/2002 | Hu | H01L 21/28114 438/182 |
| 2003/0207588 A1 | 11/2003 | Goldbach | |
| 2007/0243712 A1* | 10/2007 | Rusu | H01L 21/31122 438/700 |
| 2008/0096357 A1* | 4/2008 | Suh | H01L 27/11568 438/287 |
| 2010/0001271 A1* | 1/2010 | Mieno | H01L 27/11568 257/57 |
| 2012/0074376 A1* | 3/2012 | Kumar | G11C 13/0007 257/4 |
| 2012/0091414 A1* | 4/2012 | Iwakaji | H01L 21/02425 257/2 |
| 2012/0211719 A1* | 8/2012 | Haimoto | H01L 45/085 257/4 |

(Continued)

FOREIGN PATENT DOCUMENTS

KR 10-2008-0060363 A 7/2008

*Primary Examiner* — Latanya N Crawford
(74) *Attorney, Agent, or Firm* — Perkins Coie LLP

(57) ABSTRACT

An electronic device comprising a semiconductor memory unit that includes a resistance variable element formed over a substrate, and including stacked therein a bottom electrode, a variable resistance layer and a top electrode, and a barrier layer formed over the resistance variable element, and including an amorphous silicon layer which is doped with at least one kind of impurity.

20 Claims, 8 Drawing Sheets

(56) References Cited

U.S. PATENT DOCUMENTS

| | | | |
|---|---|---|---|
| 2013/0102123 A1* | 4/2013 | Tsai | H01L 27/10867 438/386 |
| 2013/0164903 A1* | 6/2013 | Lee | H01L 28/90 438/381 |
| 2013/0270510 A1* | 10/2013 | Fujii | H01L 45/04 257/5 |
| 2014/0097396 A1* | 4/2014 | Murase | H01L 45/146 257/2 |
| 2014/0329380 A1* | 11/2014 | Cheng | H01L 21/28008 438/587 |

* cited by examiner

ELECTRONIC DEVICE AND METHOD FOR FABRICATING THE SAME

CROSS-REFERENCE TO RELATED APPLICATIONS

The present application claims priority of Korean Patent Application No. 10-2013-0031611, entitled "SEMICONDUCTOR DEVICE AND METHOD FOR MANUFACTURING THE SAME, AND MICRO PROCESSOR, PROCESSOR, SYSTEM, DATA STORAGE SYSTEM AND MEMORY SYSTEM INCLUDING THE SEMICONDUCTOR DEVICE," and filed on Mar. 25, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such electronic devices have been conducted. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device. According to the disclosed technology, an electronic device and a method for fabricating the same are provided to having a barrier layer with a high selectivity with respect to a target processing layer.

In one aspect, an electronic device is provided to include a semiconductor memory unit that includes: a resistance variable element formed over a substrate, and including stacked therein a bottom electrode, a variable resistance layer and a top electrode; and a barrier layer formed over the resistance variable element, and including an amorphous silicon layer which is doped with at least one kind of impurity.

In another aspect, an electronic device is provided to include a semiconductor memory unit that includes: a target processing layer including a variable resistance layer interposed between a bottom electrode and a top electrode and patterned to form one or more variable resistance elements; and a barrier layer formed over the target processing layer, and including an amorphous silicon layer which is doped with one or more impurities.

In another aspect, an electronic device is provided to include a semiconductor device that includes: a target processing layer; and a barrier layer formed over the target processing layer, and including an amorphous silicon layer which is doped with at least one kind of impurity.

In some implementations, the semiconductor memory unit may further include: a switching element formed in the substrate, a first interlayer dielectric layer formed between the substrate and the variable resistance element, a bottom contact plug passing through the first interlayer dielectric layer and coupling the switching element and the variable resistance element, a second interlayer dielectric layer formed over the first interlayer dielectric layer, a conductive line formed over the second interlayer dielectric layer, and a top contact plug passing through the second interlayer dielectric layer and the barrier layer and coupling the conductive line and the variable resistance element. In some implementations, the impurities may include boron (B), aluminum (Al), gallium (Ga), indium (In), thallium (Tl), carbon (C), germanium (Ge), tin (Sn), or lead (Pb). In some implementations, an amorphous silicon layer is doped with boron (B). In some implementations, the amorphous silicon layer is doped with boron (B) and germanium (Ge). In some implementations, the amorphous silicon layer is doped to include (1) a first element selected from boron (B), aluminum (Al), gallium (Ga), indium (In) or thallium (Tl) and (2) a second element selected from carbon (C), germanium (Ge), tin (Sn) or lead (Pb). In some implementations, the variable resistance layer may include a stack layer in which a tunnel barrier layer is interposed between two magnetic layers. In some implementations, the variable resistance layer may include a metal oxide. In some implementations, the variable resistance layer may include a phase change material. In some implementations, the top electrode and the bottom electrode may include metallic layers. In some implementations, the barrier layer may further include dielectric layers. In some implementations, the dielectric layers are formed over or/and under the amorphous silicon layer doped with at least one kind of impurity.

In some implementations, the electronic device may further include a microprocessor that includes: a control unit suitable for receiving a signal including a command from an external device, performing extraction, decoding and controlling upon input and output of the microprocessor; an operation unit suitable for performing an operation according to a signal transmitted from the control unit; and a memory unit suitable for storing data for performing the operation of the operation unit, data corresponding to an operated result, or an address of the data to perform the operation, In some implementations, the memory unit may include the barrier layer formed over the resistance variable element that is switched between different resistance states, and including an amorphous silicon layer which is doped with at least one kind of impurity. In some implementations, the memory unit may include the semiconductor memory unit and each variable resistance element is switched between different resistance states in response to a control signal applied thereto.

In some implementations, the electronic device may further include a processor that includes: a core unit suitable for performing an operation corresponding to a command using data based on the command inputted from an external device; a cache memory unit suitable for storing data for performing the operation, data corresponding to an operated result, or an address of the data for performing the operation; and a bus interface, coupled between the core unit and the cache memory unit, suitable for transmitting data between the core unit and the cache memory unit. In some implementations, the cache memory unit may include the barrier layer formed over the resistance variable element that is switched between different resistance states, and including an amorphous silicon layer which is doped with at least one kind of impurity. In some implementations, the cache memory unit includes the semiconductor memory unit and each variable resistance element is switched between different resistance states in response to a control signal applied thereto.

In some implementations, the electronic device may further include a processing system that includes: a processor suitable for analyzing a received command and controlling an operation of information based on an analyzed result; an auxiliary memory device suitable for storing the information and a program for analyzing the command; a main memory device suitable for transferring and storing the program and the information from the auxiliary memory device such that the processor performs the operation using the information and the program; and an interface device suitable for performing a communication with at least one of the processor, the auxiliary memory device and the main memory device. In some implementations, at least one of the auxiliary memory device and the main memory device may include the barrier layer formed over the resistance variable element that is switched between different resistance states, and including an amorphous silicon layer which is doped with at least one kind of impurity. In some implementations, at least one of the auxiliary memory device and the main memory device includes the semiconductor memory unit and each variable resistance element is switched between different resistance states in response to a control signal applied thereto. In some implementations, the target processing layer may include a variable resistance layer or/and a metallic layer.

In some implementations, the electronic device may further include a data storage system that includes: a storage device suitable for storing data and maintaining stored data irrespective of a supplied power; a controller suitable for controlling an input and output of the data of the storage device based on a command inputted from an external device; a temporary storage device suitable for temporarily storing data exchanged between the storage device and the external device; and an interface suitable for performing a communication with at least one of the storage device, the controller and the temporary storage device. In some implementations, at least one of the storage device and the temporary storage device may include the barrier layer formed over the resistance variable element that is switched between different resistance states, and including an amorphous silicon layer which is doped with at least one kind of impurity. In some implementations, at least one of the storage device and the temporary storage device includes the semiconductor memory unit and each variable resistance element is switched between different resistance states in response to a control signal applied thereto.

In some implementations, the electronic device may further include a memory system that includes: a memory suitable for storing data and maintaining stored data irrespective of a supplied power; a memory controller suitable for controlling an input or output of the data of the memory in response to a command inputted from an external device; a buffer memory suitable for buffering data, which are exchanged between the memory and the external device; and an interface suitable for performing a communication with at least one of the memory, the memory controller and the buffer memory. In some implementations, at least one of the memory and the buffer memory may include the barrier layer formed over the resistance variable element that is switched between different resistance states, and including an amorphous silicon layer which is doped with at least one kind of impurity. In some implementations, wherein at least one of the memory and the buffer memory includes the semiconductor memory unit and each variable resistance element is switched between different resistance states in response to a control signal applied thereto.

In another aspect, a method for fabricating an electronic device is provided to include: forming a target processing layer, forming a barrier layer over the target processing layer to include an amorphous silicon layer which is doped with one or more impurities; patterning the barrier layer, and etching the target processing layer using the patterned barrier layer.

In some implementations, the target processing layer may include a variable resistance layer or/and a metallic layer. In some implementations, the target processing layer includes a variable resistance element that switches between two different resistance states. In some implementations, the variable resistance layer may include a stack layer in which a tunnel barrier layer is interposed between two magnetic layers. In some implementations, the variable resistance layer may include a metal oxide. In some implementations, the variable resistance layer may include a phase change material. In some implementations, the target processing layer includes a variable resistance layer which switches between two different resistance states and includes a metal oxide. In some implementations, the target processing layer includes a phase change material. In some implementations, the forming of the barrier layer may be performed at a temperature equal to or lower than 300° C. In some implementations, the one or more impurities may include boron (B), aluminum (Al), gallium (Ga), indium (In) and thallium (Tl), carbon (C), germanium (Ge), tin (Sn) or lead (Pb). In some implementations, the or more impurities include (1) a first element selected from boron (B), aluminum (Al), gallium (Ga), indium (In) or thallium (Tl) and (2) a second element selected from carbon (C), germanium (Ge), tin (Sn) or lead (Pb). In some implementations, the barrier layer may include an amorphous silicon layer which is doped with boron (B), or an amorphous silicon layer which is doped with boron (B) and germanium (Ge). In some implementations, the forming of the barrier layer may include forming one or more dielectric layers. In some implementations, the patterning of the barrier layer may include: forming a photoresist pattern over the barrier layer; etching the barrier layer using the photoresist pattern; and removing the photoresist pattern. In some implementations, the removing of the photoresist pattern may include: performing an oxygen plasma process; and performing a cleaning process using a hydrofluoric acid-based material.

In yet another aspect, a method for fabricating an electronic device is provided to include: providing a target processing layer to which a predetermined process is performed; applying a barrier layer over the target processing layer, the barrier layer including an amorphous silicon layer which is doped with one or more impurities; performing the predetermined process using the barrier layer; and controlling a processing temperature at or lower than 300° C. to prevent the degradation of the target processing layer.

In some implementations, the one or more impurities include boron (B), aluminum (Al), gallium (Ga), indium (In), thallium (Tl), carbon (C), germanium (Ge), tin (Sn) or lead (Pb). In some implementations, The one or more impurities include a combination of (1) a first element selected from boron (B), aluminum (Al), gallium (Ga), indium (In) or thallium (Tl) and (2) a second element selected from carbon (C), germanium (Ge), tin (Sn) or lead (Pb). In some implementations, the method may further include controlling the one or more impurities to increase a selectivity of the barrier layer with respect to the target processing layer in the predetermined process. In some implementations, the amorphous silicon layer doped with the one or more impurities is formed by reacting a silicon source gas with one or more gases having the one or more impurities. In some implementations, the method may further include forming a photoresist pattern over the barrier layer before performing the predetermined process using the barrier layer; and subsequently removing the photoresist pattern after performing the predetermined process, where the amorphous silicon layer in the barrier layer that is free of grains and grain boundaries functions not to degrade surface roughness during removing the photoresist pattern.

These and other aspects, implementations and associated advantages are described in greater detail in the drawings, the description and the claims.

DETAILED DESCRIPTION

Figure 1A:
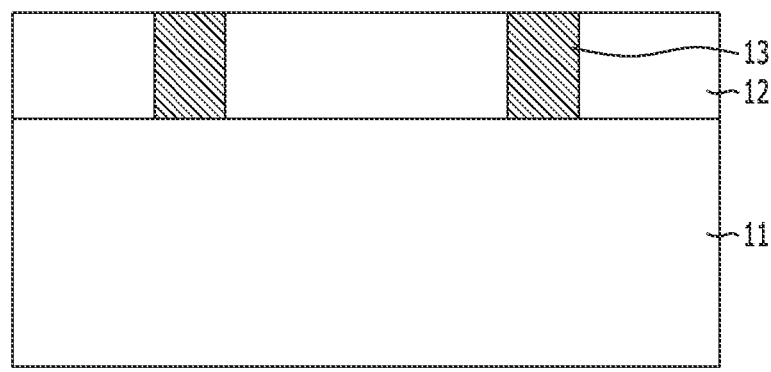
FIGS. 1A to 1G are cross-sectional views explaining a method for fabricating an electronic device in accordance with an implementation of the disclosed technology of this patent document.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following implementations of the present disclosure provide an electronic device including a barrier layer with a superior selectivity with respect to a target processing layer and a method for fabricating the same. Herein, the target processing layer refers to a target layer to which a predetermined process such as an etching process, a polishing process or a cleaning process is applied to process the target layer, and may include a single layer including one material layer or a stack layer including a plurality of different material layers. The barrier layer refers to a material layer serving as a mask, a polish stop layer, an etch stop layer or a protection layer with respect to the target processing layer. Such a barrier layer may include a single layer having one material layer or a stack layer including a plurality of different material layers.

A target processing layer may include a material layer of which characteristics are subject to degradation or deterioration at a high temperature, for example, a temperature higher than 300° C. The characteristics of the material layer which are degraded under a high temperature condition higher than 300° C. may include properties such as the resistance of the target processing layer, a crystalline structure of the target processing layer, a stress of the target processing layer, and so forth. For example, a material layer of which characteristics are degraded under a high temperature condition may include a variable resistance layer, a metallic layer, and so forth. The metallic layer refers to a conductive material layer including a metal, and may include a metal layer, a metal oxide layer, a metal nitride layer, a metal oxynitride layer, a metal silicide layer, and so forth. The variable resistance layer refers to a material layer having a characteristic that can be switched between different resistance states in response to external stimuli (for example, voltages or current), and may include a single layer or a stack layer of two or more layers. The variable resistance layer may include a phase change material. The phase change material may include a chalcogen compound. The crystal state of the phase change material is changed to an amorphous state or a crystalline state by external stimuli. The phase change material may have a characteristic switched between different resistance states. Also, the variable resistance layer may include a metal oxide. The metal oxide may include a transition metal oxide (TMO), a perovskite-based oxide, or the like. The metal oxide includes vacancies in a layer, and may have a characteristic switched between different resistance states by creation and extinction of conductive paths according to the behavior of vacancies by external stimuli. Further, the variable resistance layer may include a stack layer in which a tunnel barrier layer is interposed between two magnetic layers. The stack layer in which a tunnel barrier layer is interposed between two magnetic layers may be referred to as a magnetic tunnel junction (MTJ). The stack layer in which a tunnel barrier layer is interposed between two magnetic layers may have a characteristic switched between different resistance states according to magnetization directions of the two magnetic layers. For example, when the magnetization directions of the two magnetic layers are the same with each other, the stack layer may be in a low resistance state. When the magnetization directions of the two magnetic layers are different from each other, the stack layer may be in a high resistance state.

While the above shows examples of the variable resistance layer, the variable resistance layer may be implemented in various ways to achieve a desired characteristic that can be switched between different resistance states by external stimuli. With the switching characteristic, the variable resistance layer can be used in various fields and gain popularities these days. For instance, a variable resistance layer may be used as a data storage for storing data.

An electronic device and a method for fabricating the same according to the following implementations of the disclosed technology in this patent document provide a barrier layer providing a superior selectivity with respect to a target processing layer including a material layer of which characteristics may be degraded under a high temperature condition. Such a barrier layer is capable of being formed at a low temperature, for example, a temperature equal to or lower than 300° C. To this end, the electronic device and the method for fabricating the same according to implementations of the disclosed technology in this patent document provide a barrier layer which is formed on a target processing layer and includes an amorphous silicon layer doped with at least one kind of impurity or different types of impurities. The barrier layer may further include one or more dielectric layers which are formed over or under the doped amorphous silicon layer. In some implementations, the dielectric layers of the barrier layer may be formed over and under the doped amorphous silicon layer.

A silicon layer is used as a barrier layer because it has a superior selectivity with respect to various material layers included in an electronic device, such as a dielectric layer including an oxide layer, a nitride layer or the like, a metallic layer, and so forth.

The silicon layer serving as a barrier layer is formed to have an amorphous state, which enables the barrier layer to be formed at a low temperature equal to or lower than 300° C. and provides a superior surface roughness. A high temperature condition exceeding 300° C. is used to form a silicon layer having a poly-crystalline state. The surface roughness of an amorphous silicon layer having no grain boundary is superior to a poly-crystalline silicon layer having a plurality of grain boundaries. That is to say, the surface of an amorphous silicon layer is more planar than a poly-crystalline silicon layer and essentially a contiguous planar surface that is not divided into different regions of surfaces having different levels of surface roughness.

One or more different types of impurity, can be doped into an amorphous silicon layer so that the doped amorphous silicon layer can serve as a barrier layer to allow the barrier layer to be formed at a low temperature equal to or lower than 300° C. This formation under the low temperature can be used to increase the film quality (in particular, hardness), and to increase a selectivity with respect to a target processing layer. The impurity may include one of a first group of elements: boron (B), aluminum (Al), gallium (Ga), indium (In) and thallium (Tl). For instance, the barrier layer may be an amorphous silicon layer which is doped with boron (B). Further, the impurity may include any one selected from a second group of elements: carbon (C), germanium (Ge), tin (Sn) and lead (Pb). For instance, the barrier layer may be an amorphous silicon layer which is doped with germanium (Ge). Moreover, the impurity may include the combination of any one of one selected from the first group and any one selected from the second group. For instance, the barrier layer may be an amorphous silicon layer which is doped with boron (B) and germanium (Ge).

In examples disclosed below, a barrier layer with a superior selectivity with respect to a target processing layer is applied to a method for fabricating an electronic device including a variable resistance layer, a metallic layer, and so forth. The variable resistance layer may be used as a data storage for storing data (or logic information). For the ease of explanation, in the following descriptions, the barrier layer is an amorphous silicon layer which is doped with boron (B) or an amorphous silicon layer which is doped with boron (B) and germanium (Ge). However, other implementations are also possible such that the barrier layer is doped with other impurities.

FIGS. 1A to 1G are cross-sectional views explaining a method for fabricating an electronic device in accordance with an implementation of the disclosed technology in this patent document.

As shown in FIG. 1A, a substrate 11, which is formed with a predetermined structure, for example, having one or more switching elements (not shown), is provided. Such a switching element is to select a particular unit element among a plurality of unit elements included in the electronic device. The switching elements may include transistors, diodes, or the likes. One end of the switching element may be electrically coupled to bottom contact plugs 13 as will be described below. The other end of the switching element may be electrically coupled to a wiring line, for example, a source line.

A first interlayer dielectric layer 12 is formed on the substrate 11 which is formed with the predetermined structure. The first interlayer dielectric layer 12 may be formed as any one single layer or a stack layer including at least two of an oxide layer, a nitride layer and an oxynitride layer.

The bottom contact plugs 13 are formed through the first interlayer dielectric layer 12 to be coupled to the one end of the switching element. The bottom contact plugs 13 may be formed through a series of processes for defining contact holes including selectively etching the first interlayer dielectric layer 12 and gap-filling a conductive material in the contact holes. The bottom contact plugs 13 may be formed as a metallic layer.

Figure 1B:
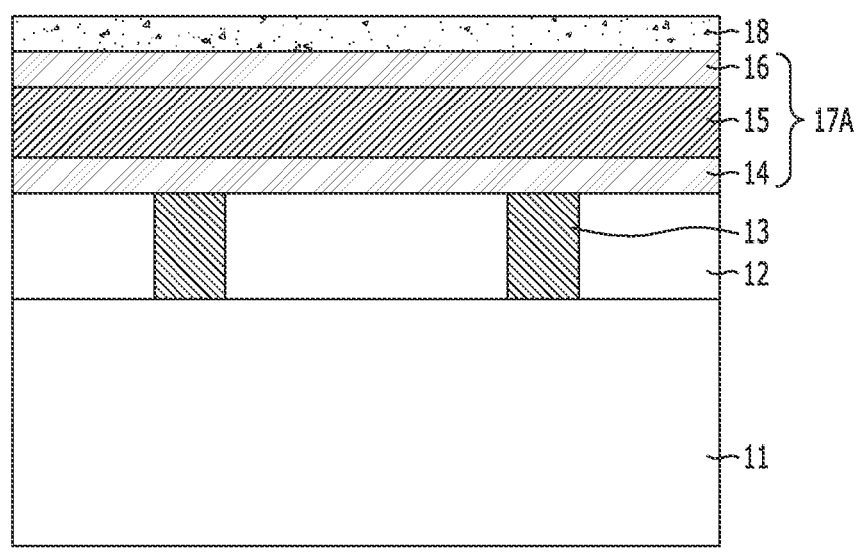

As shown in FIG. 1B, a stack layer 17A, in which a first conductive layer 14, a variable resistance layer 15 and a second conductive layer 16 are sequentially stacked, is formed on the first interlayer dielectric layer 12 including the bottom contact plugs 13. The first conductive layer 14 and the second conductive layer 16 may include one or more metallic layer, and the variable resistance layer 15 may include a material layer switched between different resistance states by external stimuli.

A first barrier layer 18 is formed on the stack layer 17A. In order to prevent the characteristic of the already-formed stack layer 17A from being thermally degraded during a process for forming the first barrier layer 18, the first barrier layer 18 may be formed at a low temperature equal to or lower than 300° C. To this end, the first barrier layer 18 may be formed as an amorphous silicon layer which is doped with impurities including at least one type of impurity. For instance, the first barrier layer 18 may be formed as an amorphous silicon layer which is doped with boron (B).

The amorphous silicon layer, which is doped with boron (B), may be formed by reacting a silicon source gas (for example, $SiH_4$) and a boron source gas (for example, $B_2H_6$). In order to form the amorphous silicon layer doped with boron (B) under a low temperature condition equal to or lower than 300° C., a process may be performed in a state in which the partial pressures of the silicon source gas and the boron source gas are increased to produce a desired pressure condition in the chamber. For instance, in a state in which a pressure in a chamber is retained at 10 torr or higher, the partial pressure of the silicon source gas may be retained at 3 torr or higher, and the partial pressure of the boron source gas may be retained at 1 torr or higher. Meanwhile, in order to form the amorphous silicon layer doped with boron (B) under a low temperature condition equal to or lower than 300° C., a process may be performed under a plasma condition while increasing the partial pressures of the source gases.

In various implementations, it is impossible or difficult to perform a process for forming a crystalline silicon layer (e.g., a poly-crystalline silicon layer) under a low temperature condition equal to or lower than 300° C. because a silicon source gas is not resolved at the low temperature. However, an amorphous silicon layer which is doped with boron (B) may be formed under a low temperature condition, by decreasing a reaction temperature and activating the reaction of the silicon source gas and the boron source gas. The reaction temperature may be decreased by injecting a boron source gas into a chamber and the reaction of the silicon source gas and the boron source gas may be activated by increasing the partial pressures thereof. Further, because a silicon layer is formed under a low temperature circumstance, a silicon layer of an amorphous state may be formed.

In implementations, the first barrier layer 18 can be formed as a single layer including an amorphous silicon layer which is doped with at least one kind of impurity, or, in order to secure an additional process margin, the first barrier layer 18 may be formed as a stack layer including one or more dielectric layers which are formed over or/and under the doped amorphous silicon layer doped. The dielectric layer may be a single layer or a stack layer of at least two layers formed of layers selected from an oxide layer, a nitride layer and an oxynitride layer.

Figure 1C:
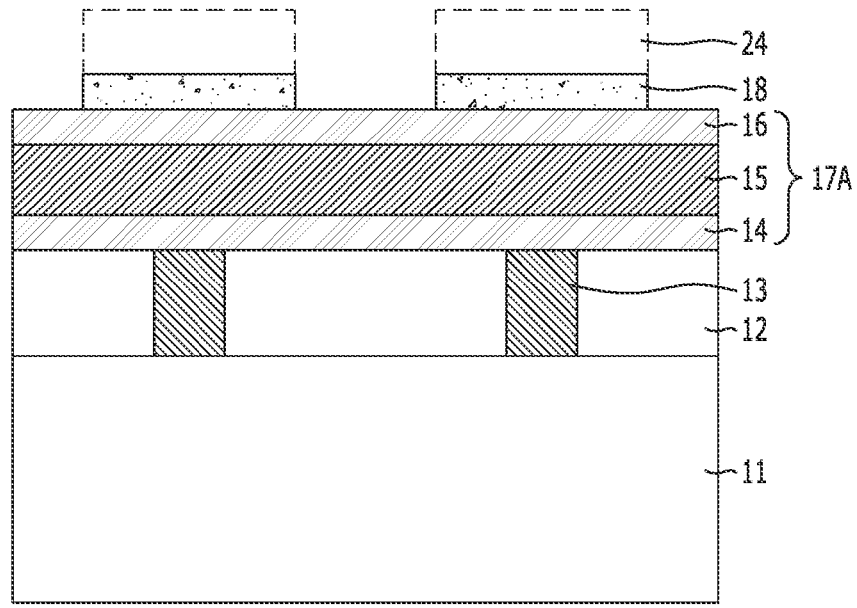

As shown in FIG. 1C, after forming a photoresist pattern 24 on the first barrier layer 18, the first barrier layer 18 is patterned using the photoresist pattern 24.

The photoresist pattern 24 is removed. The photoresist pattern 24 may be removed through an oxygen plasma process. The exposed surface of the first barrier layer 18 may be oxidized in the course of removing the photoresist pattern 24 through the oxygen plasma process.

A cleaning process is performed to remove remaining residues and by-products after patterning the first barrier layer 18 and removing the photoresist pattern 24. The cleaning process may be performed using a hydrofluoric acid-based material. As the hydrofluoric acid-based material, a BOE (buffered oxide etchant) or a hydrofluoric acid solution may be used. The oxide layer formed on the surface of the first barrier layer 18 in the course of removing the photoresist pattern 24 may also be removed during the cleaning process.

For the reference, if a poly-crystalline silicon layer is applied as the first barrier layer 18, an oxide layer is formed on the surface of the poly-crystalline silicon layer when removing the photoresist pattern 24 by oxygen plasma, and is removed in the cleaning process. When the surface of the poly-crystalline silicon layer is oxidized, oxidation occurs more frequently on a grain boundary than on a grain surface, which results in the degradation of a surface roughness. Further, this problem, i.e., the degradation of the surface roughness, becomes more serious in a cleaning process using a hydrofluoric acid-based material. The degradation in the surface roughness of a material layer which is used as a barrier layer makes a negative effect on subsequent processes and the negative effect becomes serious as the degree of integration increases. Thus, it is necessary to substantially prevent the surface roughness of the barrier layer from being degraded.

In the implementation of the disclosed technology in this patent document, because an amorphous silicon layer is applied as the first barrier layer 18, it is possible to prevent the surface roughness of the first barrier layer 18 from being degraded in the removing the photoresist pattern 24 and in the cleaning process. Since an amorphous silicon layer does not have grains and grain boundaries that tend to occur in a poly-crystalline silicon layer, the surface of the amorphous silicon layer may be uniformly oxidized even during the process for removing the photoresist pattern 24 by oxygen plasma.

Figure 1D:
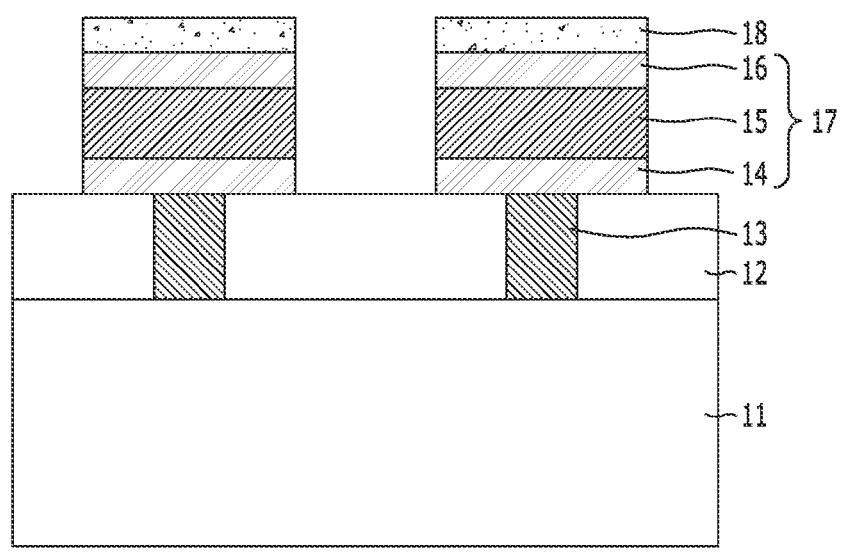

As shown in FIG. 1D, the stack layer 17A is etched using the first barrier layer 18. Thus, a variable resistance element 17 is formed, which includes a bottom electrode 14, the variable resistance layer 15 and a top electrode 16 that are sequentially stacked. In an etching process, the first barrier layer 18 serves as a hard mask for the stack layer 17A. The etching process may be performed as dry etching.

After performing the etching process for forming the resistance variable elements 17, a cleaning process may be performed. Although the first barrier layer 18 remains in the present implementation even after the etching process, other implementations are also possible. For example, the first barrier layer 18 may be removed after the etching process, for example, in the cleaning process.

While not shown in a drawing, spacers may be formed on the sidewalls of the resistance variable elements 17 after the etching process.

Figure 1E:
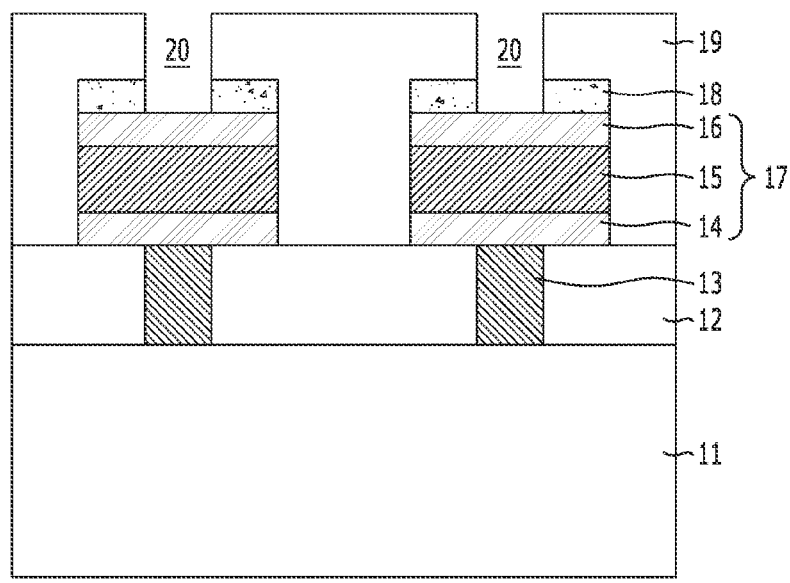

As shown in FIG. 1E, a second interlayer dielectric layer 19 is formed on the first interlayer dielectric layer 12 to cover the variable resistance elements 17 and the first barrier layer 18. The second interlayer dielectric layer 19 may be formed as any single layer or a stack layer including at least two of an oxide layer, a nitride layer and an oxynitride layer.

By selectively etching the second interlayer dielectric layer 19 and the first barrier layer 18, contact holes 20 are defined to expose the top electrodes 16 of the variable resistance elements 17. In a process for defining the contact holes 20, the first barrier layer 18 serves as an etch stop layer.

Figure 1F:
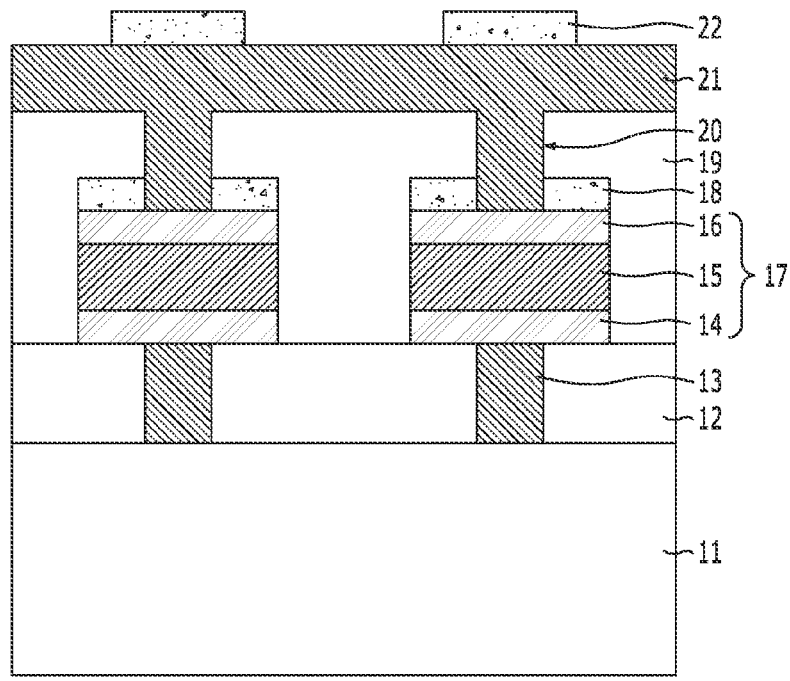

As shown in FIG. 1F, a third conductive layer 21 is formed on the second interlayer dielectric layer 19 to gap-fill the contact holes 20. The third conductive layer 21 may be formed as a metallic layer.

A second barrier layer 22 is formed on the third conductive layer 21. In order to prevent the structure including the already-formed third conductive layer 21 from being thermally degraded in a process for forming the second barrier layer 22, the second barrier layer 22 may be formed at a low temperature equal to or lower than 300° C. To this end, the second barrier layer 22 may be formed as an amorphous silicon layer which is doped with one or more different types of impurities. For example, the second barrier layer 22 may be formed as an amorphous silicon layer which is doped with boron (B) and germanium (Ge).

The amorphous silicon layer, which is doped with boron (B) and germanium (Ge), may be formed by reacting a silicon source gas (for example, $SiH_4$), a boron source gas (for example, $B_2H_6$) and a germanium source gas (for example, $GeH_4$). In order to form the amorphous silicon layer which is doped with boron (B) and germanium (Ge), under a low temperature condition equal to or lower than 300° C., a process may be performed in a state in which the partial pressures of the silicon source gas, the boron source gas and the germanium source gas are increased. For example, in a state in which a pressure in a chamber is retained at 10 torr or over, the partial pressure of the silicon source gas may be retained at 3 torr or over, the partial pressure of the boron source gas may be retained at 1 torr or over, and the partial pressure of the germanium source gas may be retained at 0.4 torr or over. Meanwhile, in order to form the amorphous silicon layer doped with boron (B) and germanium (Ge) under a low temperature condition equal to or lower than 300° C., a process may be performed under a plasma condition while increasing the partial pressures of the source gases.

As one example, it has been explained that the second barrier layer 22 is formed as a single layer including an amorphous silicon layer which is doped with one or more different types of impurities. However, in order to secure an additional process margin, the second barrier layer 22 may be formed as a stack layer including one or more dielectric layers which are formed over or/and under the doped amorphous silicon layer. The dielectric layer may be a single layer or a stack layer including at least two layers selected an oxide layer, a nitride layer and an oxynitride layer.

After forming a photoresist pattern (not shown) on the second barrier layer 22, the second barrier layer 22 is patterned using the photoresist pattern.

After removing the photoresist pattern, a cleaning process for removing residues and by-products is performed. The photoresist pattern may be removed by an oxygen plasma process, and the cleaning process may be performed using a hydrofluoric acid-based material.

Figure 1G:
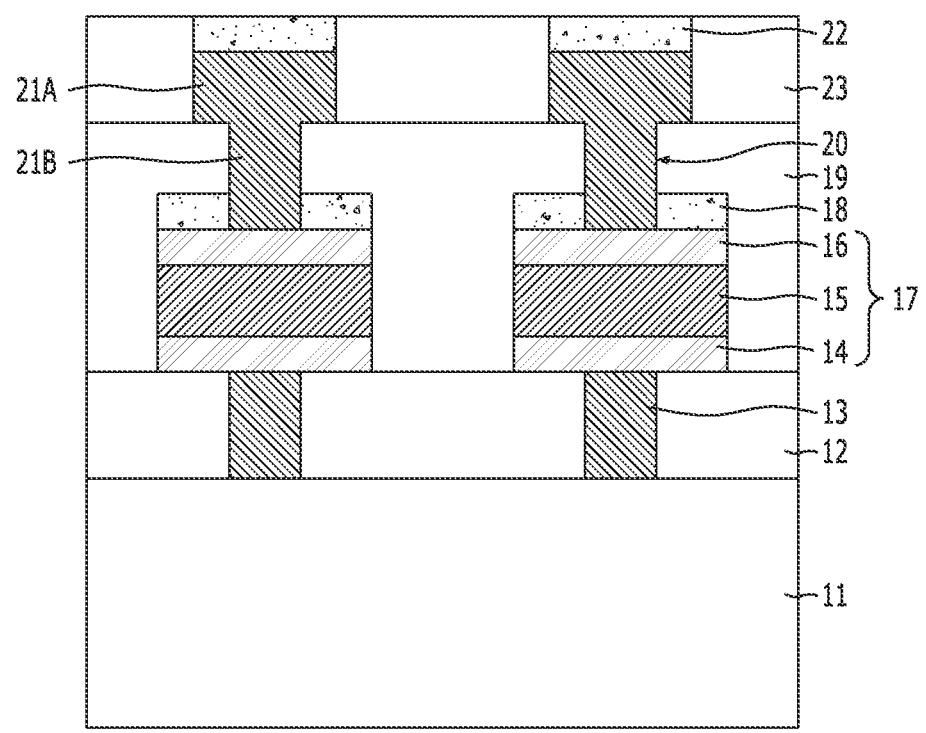

As shown in FIG. 1G, conductive lines 21A are formed by etching the third conductive layer 21 using the second barrier layer 22. Further, top contact plugs 21B which electrically couple the conductive lines 21A and the variable resistance elements 17 are formed. The conductive lines 21A may form bit lines.

As the degree of integration of an electronic device increases, uniform patterning becomes important because a resistance difference can be caused among metal lines in the process for forming the conductive lines 21A, for example, the process for forming metal lines. The second barrier layer 22 including the amorphous silicon layer which has a superior surface roughness facilitates uniform patterning of the conductive lines 21A.

A third interlayer dielectric layer 23 is formed on the second interlayer dielectric layer 19 to cover the conductive lines 21A. The third interlayer dielectric layer 23 may be formed as a single layer including any layer or a stack layer including at least two of an oxide layer, a nitride layer and an oxynitride layer.

A planarization process is performed until the second barrier layer 22 is exposed. The planarization process may be performed using CMP (chemical mechanical polishing). In the planarization process, the second barrier layer 22 serves as a polish-stop layer.

Thereafter, an electronic device may be completed using well-known semiconductor fabrication technologies.

The electronic device, which is fabricated through the above-processes, may include the substrate 11 which includes switching elements (not shown), the first interlayer dielectric layer 12 which is formed on the substrate 11, the resistance variable elements 17 which are formed on the first interlayer dielectric layer 12 and in which the bottom electrodes 14, the variable resistance layer 15 and the top electrodes 16 are stacked, the bottom contact plugs 13 which pass through the first interlayer dielectric layer 12 and couple the switching elements and the resistance variable elements 17, the first barrier layer 18 which is formed on the resistance variable elements 17 and includes the amorphous silicon layer doped with one or more different types of impurities, the second interlayer dielectric layer 19 which is formed on the first interlayer dielectric layer 12, the conductive lines 21A which are formed on the second interlayer dielectric layer 19, and the top contact plugs 21B which pass through the second interlayer dielectric layer 19 and the first barrier layer 18 and couple the conductive lines 21A and the resistance variable elements 17.

Since the barrier layer including an amorphous silicon layer doped with one or more different types of impurities is provided, it is possible to prevent the thermal characteristics of a target etching layer from being degraded and provide a superior selectivity with respect to the target etching layer. In addition, it is possible to improve the uniformity in patterning the target etching layer.

Figure 2:
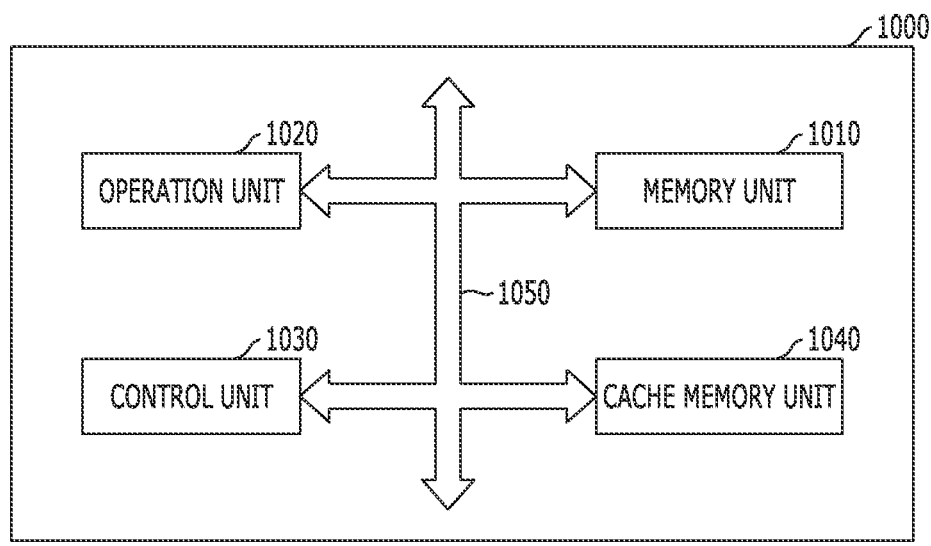
FIG. 2 is an example of configuration diagram of a microprocessor implementing memory circuitry based on the disclosed technology.

FIG. 2 is an example of configuration diagram of a microprocessor implementing memory circuitry based on the disclosed technology.

Referring to FIG. 2, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described electronic devices in accordance with the implementations. For example, the memory unit may include the barrier layer formed over the target processing layer including the variable resistance element switched between different resistance states, and including an amorphous silicon layer which is doped with one or more different types of impurities. The impurity may include any one of boron (B), aluminum (Al), gallium (Ga), indium (In) and thallium (Tl), any one of carbon (C), germanium (Ge), tin (Sn) and lead (Pb), or the combination of (1) one or more elements selected from boron (B), aluminum (Al), gallium (Ga), indium (In) and thallium (Tl) and (2) one or more elements selected from carbon (C), germanium (Ge), tin (Sn) and lead (Pb). Through this, it is possible to prevent the thermal characteristics of a target processing layer from being degraded and provide a superior selectivity with respect to the target processing layer. In addition, it is possible to improve the performance and the stability of the memory unit 1010 and the microprocessor 1000 including the memory unit 1010.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which may temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 3:
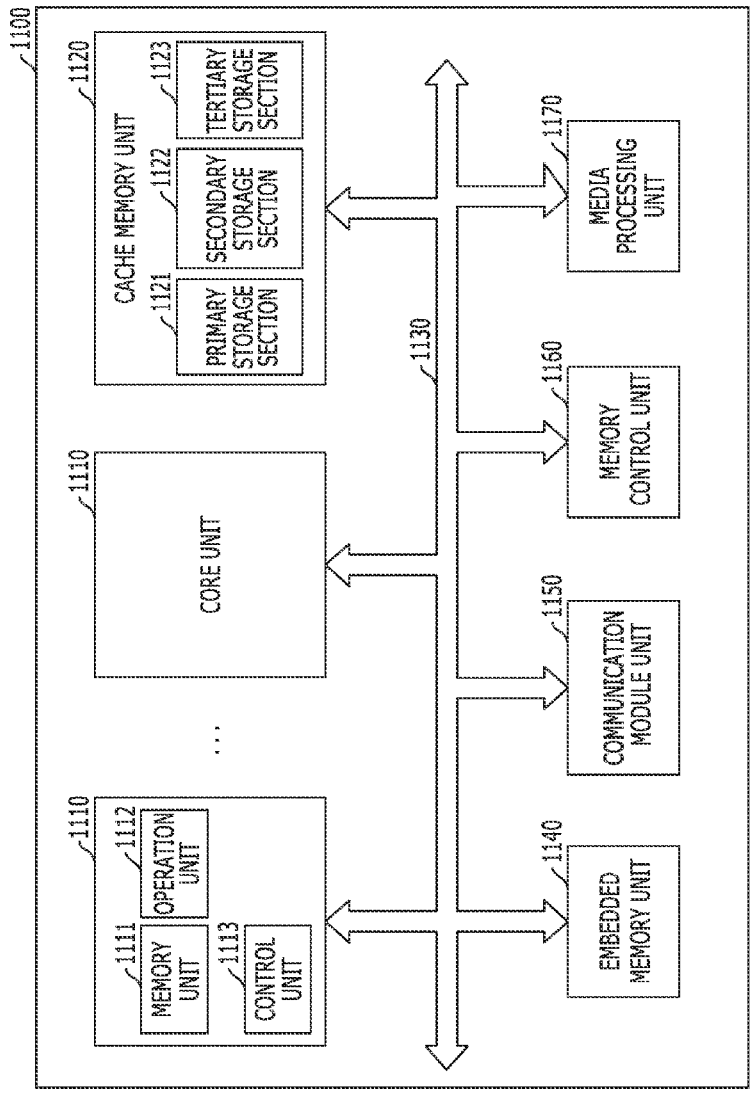
FIG. 3 is an example of configuration diagram of a processor implementing memory circuitry based on the disclosed technology.

FIG. 3 is an example of configuration diagram of a processor implementing memory circuitry based on the disclosed technology.

Referring to FIG. 3, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

At least one storage section of the primary storage section 1121, the secondary storage section 1122 and the tertiary storage section 1123 of the cache memory unit 1120 may include one or more of the above-described electronic devices in accordance with the implementations. For example, the cache memory unit 1120 may include the barrier layer formed over the target processing layer including the variable resistance element switched between different resistance states, and including an amorphous silicon layer which is doped with one or more different types of impurities. The impurity may include any one of boron (B), aluminum (Al), gallium (Ga), indium (In) and thallium (Tl), any one of carbon (C), germanium (Ge), tin (Sn) and lead (Pb), or the combination including any one of boron (B), aluminum (Al), gallium (Ga), indium (In) and thallium (Tl) and any one of carbon (C), germanium (Ge), tin (Sn) and lead (Pb). Through this, it is possible to prevent the thermal characteristics of a target processing layer from being degraded and provide a superior selectivity with respect to the target processing layer. In addition, it is possible to improve the performance and the stability of the cache memory unit 1120 and the processor 1100 including the same.

Although it was shown in FIG. 3 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which may transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 4:
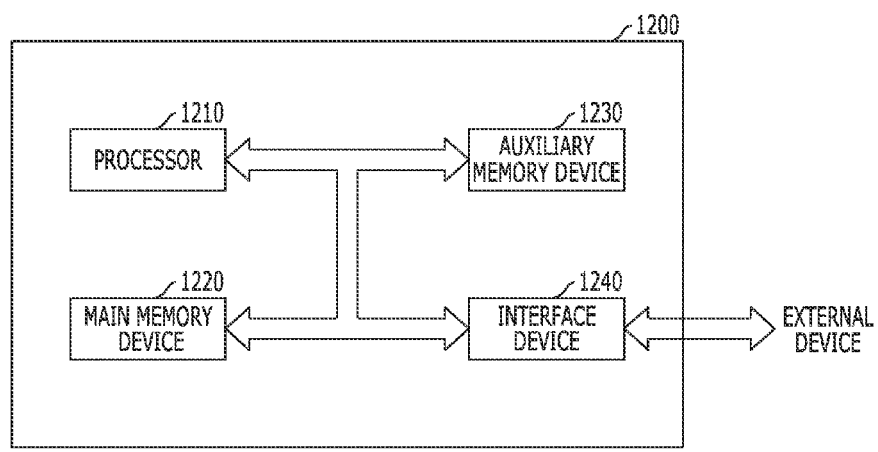
FIG. 4 is an example of configuration diagram of a system implementing memory circuitry based on the disclosed technology.

FIG. 4 is an example of configuration diagram of a system implementing memory circuitry based on the disclosed technology.

Referring to FIG. 4, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and may conserve memorized contents even when power supply is cut off. The main memory device 1220 may include one or more of the above-described electronic devices in accordance with the implementations. For example, the main memory device 1220 may include the barrier layer formed over the target processing layer including the variable resistance element switched between different resistance states, and including an amorphous silicon layer which is doped with one or more different types of impurities. The impurity may include any one of boron (B), aluminum (Al), gallium (Ga), indium (In) and thallium (Tl), any one of carbon (C), germanium (Ge), tin (Sn) and lead (Pb), or the combination including any one of boron (B), aluminum (Al), gallium (Ga), indium (In) and thallium (Tl) and any one of carbon (C), germanium (Ge), tin (Sn) and lead (Pb). Through this, it is possible to prevent the thermal characteristics of a target processing layer from being degraded and provide a superior selectivity with respect to the target processing layer. In addition, it is possible to improve the performance and the stability of the main memory device 1220 and the system 1200 including the main memory unit 1220.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the electronic devices according to the implementations, but may include a static random access memory (SRAM), a dynamic random access memory (DRAM), and so on, of a volatile memory type in which all contents are erased when power supply is cut off. The auxiliary memory device 1230 is a memory device for storing program codes or data. While the speed of the auxiliary memory device 1230 is slower than the main memory device 1220, the auxiliary memory device 1230 may store a larger amount of data.

The auxiliary memory device 1230 may include one or more of the above-described electronic devices in accordance with the implementations. For example, the auxiliary memory device 1230 may include the barrier layer formed over the target processing layer including the variable resistance element switched between different resistance states, and including an amorphous silicon layer which is doped with one or more different types of impurities. The impurity may include any one of boron (B), aluminum (Al), gallium (Ga), indium (In) and thallium (Tl), any one of carbon (C), germanium (Ge), tin (Sn) and lead (Pb), or the combination including any one of boron (B), aluminum (Al), gallium (Ga), indium (In) and thallium (Tl) and any one of carbon (C), germanium (Ge), tin (Sn) and lead (Pb). Through this, it is possible to prevent the thermal characteristics of a target processing layer from being degraded and provide a superior selectivity with respect to the target processing layer. In addition, it is possible to improve the performance and the stability of the auxiliary memory device 1230 and the system 1200 including the same.

Also, the auxiliary memory device 1230 may further include a data storage system (see the reference numeral 1300 of FIG. 5) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the electronic devices according to the implementations, but may include data storage systems (see the reference numeral 1300 of FIG. 5) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 5:
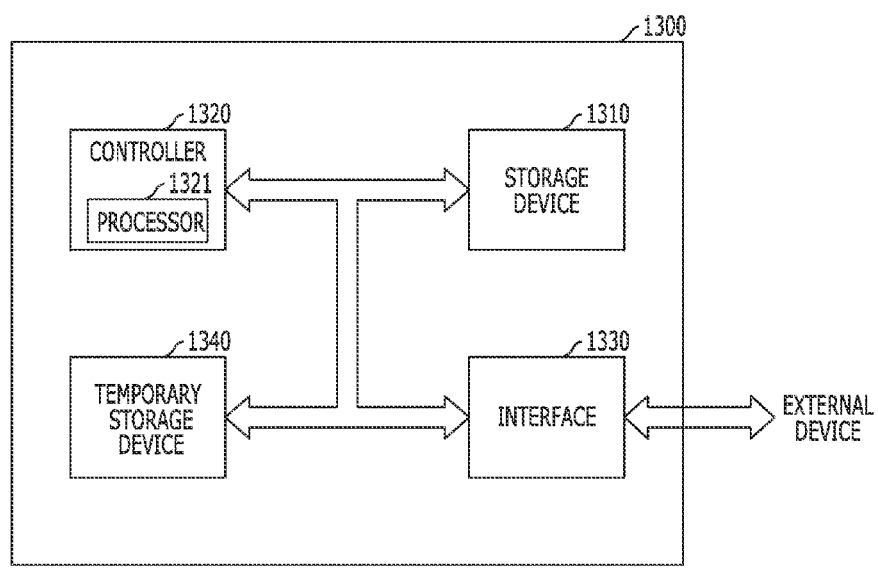
FIG. 5 is an example of configuration diagram of a data storage system implementing memory circuitry based on the disclosed technology.

FIG. 5 is an example of configuration diagram of a data storage system implementing memory circuitry based on the disclosed technology.

Referring to FIG. 5, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 may store data temporarily for efficiently transferring data between the interface 1330 and the storage device 1310 according to diversifications and high performance of an interface with an external device, a controller and a system.

Any of the storage device 1310 and the temporary storage device 1340 for temporarily storing data may include one or more of the above-described electronic devices in accordance with the implementations. The storage device 1310 or the temporary storage device 1340 may include the barrier layer formed over the target processing layer including the variable resistance element switched between different resistance states, and including an amorphous silicon layer which is doped with one or more different types of impurities. The impurity may include any one of boron (B), aluminum (Al), gallium (Ga), indium (In) and thallium (Tl), any one of carbon (C), germanium (Ge), tin (Sn) and lead (Pb), or the combination including any one of boron (B), aluminum (Al), gallium (Ga), indium (In) and thallium (Tl) and any one of carbon (C), germanium (Ge), tin (Sn) and lead (Pb). Through this, it is possible to prevent the thermal characteristics of a target processing layer from being degraded and provide a superior selectivity with respect to the target processing layer. In addition, it is possible to improve the performance and the stability of the storage device 1310 and the data storage system 1300 including the storage device 1310.

Figure 6:
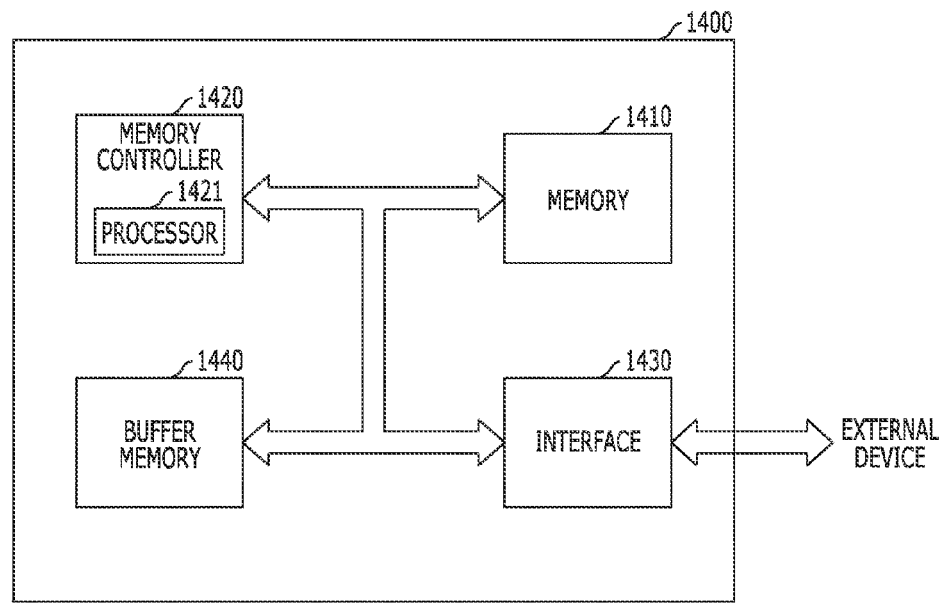
FIG. 6 is an example of configuration diagram of a memory system implementing memory circuitry based on the disclosed technology.

FIG. 6 is an example of configuration diagram of a memory system implementing memory circuitry based on the disclosed technology.

Referring to FIG. 6, the memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described electronic devices in accordance with the implementations. For example, the memory 1410 may include the barrier layer formed over the target processing layer including the variable resistance element switched between different resistance states, and including an amorphous silicon layer which is doped with at least one kind of impurity. The impurity may include any one of boron (B), aluminum (Al), gallium (Ga), indium (In) and thallium (Tl), any one of carbon (C), germanium (Ge), tin (Sn) and lead (Pb), or the combination including any one of boron (B), aluminum (Al), gallium (Ga), indium (In) and thallium (Tl) and any one of carbon (C), germanium (Ge), tin (Sn) and lead (Pb). Through this, it is possible to prevent the thermal characteristics of a target processing layer from being degraded and provide a superior selectivity with respect to the target processing layer. In addition, it is possible to improve the performance and the stability of the memory 1410 and the memory system 1400 including the memory 1410.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described electronic devices in accordance with the implementations. The buffer memory 1440 may include may include a resistance variable element capable of storing data using a characteristic that they are switched between different resistance states. The resistance variable element may include a first magnetic layer configured to have a magnetization direction pinned, a second magnetic layer configured to have a magnetization direction not pinned, and a non-magnetic layer interposed between the first magnetic layer and the second magnetic layer. Furthermore, the resistance variable element may have plane shapes including a plurality of edges. The plurality of edges may include angled edges or rounded edges. In order to reduce switching current of the resistance variable element, the number of angled edges may be larger than the number of rounded edges as the damping constant of the second magnetic layer increases. Through this, consumption power of the buffer memory 1440 may be reduced, and capacity of the buffer memory 1440 may be maximized by reducing a size thereof. As a consequence, the degree of integration of the memory system 1400 may become easy increased, and high performance and the portability of the memory system 1400 may be achieved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the electronic devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device, comprising:
    forming a target processing layer;
    forming a barrier layer over the target processing layer to include an amorphous silicon layer which is doped with one or more impurities as a mask layer to protect, in subsequent processing, each area of the target processing layer covered by the barrier layer;
    patterning the barrier layer to form a patterned barrier layer for patterning the target processing layer; and
    etching the target processing layer using the patterned barrier layer,
    wherein the target processing layer includes a variable resistance layer that switches between two different resistance states.

2. The method of claim 1, wherein the variable resistance layer includes a stack layer in which a tunnel barrier layer is interposed between two magnetic layers.

3. The method of claim 1, wherein the variable resistance layer includes a metal oxide.

4. The method of claim 1, wherein the target processing layer includes a phase change material.

5. The method of claim 1, wherein the one or more impurities include boron (B), aluminum (Al), gallium (Ga), indium (In), thallium (Tl), carbon (C), germanium (Ge), tin (Sn) or lead (Pb).

6. The method of claim 1, wherein the one or more impurities include (1) a first element selected from boron (B), aluminum (Al), gallium (Ga), indium (In) or thallium (Tl) and (2) a second element selected from carbon (C), germanium (Ge), tin (Sn) or lead (Pb).

7. The method of claim 1, wherein the forming of the barrier layer includes forming one or more dielectric layers.

8. The method of claim 1, wherein the patterning of the barrier layer includes:
    forming a photoresist pattern over the barrier layer;
    etching the barrier layer using the photoresist pattern; and
    removing the photoresist pattern.

9. The method for of claim 8, wherein the removing of the photoresist pattern includes:
    performing an oxygen plasma process; and
    performing a cleaning process using a hydrofluoric acid-based material.

10. The method of claim 1, wherein the forming of the barrier layer includes reacting a silicon source gas and a source gas of one or more impurities at a temperature at or lower than 300° C.

11. A method for fabricating an electronic device, comprising:
    providing a target processing layer to which a predetermined process is performed, wherein the target processing layer is subject to degradation or deterioration at a high temperature;
    applying a barrier layer over the target processing layer as a mask layer to protect, in subsequent processing, each area of the target processing layer covered by the barrier layer, the barrier layer including an amorphous silicon layer which is doped with one or more impurities;
    performing the predetermined process using the barrier layer; and
    controlling a processing temperature lower than 300° C. to prevent the degradation of the target processing layer.

12. The method of claim 11, wherein the one or more impurities include boron (B), aluminum (Al), gallium (Ga), indium (In), thallium (Tl), carbon (C), germanium (Ge), tin (Sn) or lead (Pb).

13. The method of claim 11, wherein the one or more impurities include a combination of (1) a first element selected from boron (B), aluminum (Al), gallium (Ga), indium (In) or thallium (Tl) and (2) a second element selected from carbon (C), germanium (Ge), tin (Sn) or lead (Pb).

14. The method of claim 11, further comprising:
    controlling the one or more impurities to increase a selectivity of the barrier layer with respect to the target processing layer in the predetermined process.

15. The method of claim 11, further comprising:
    forming a photoresist pattern over the barrier layer before performing the predetermined process using the barrier layer; and
    subsequently removing the photoresist pattern after performing the predetermined process, where the amorphous silicon layer in the barrier layer that is free of grains and grain boundaries functions not to degrade surface roughness during removing the photoresist pattern.

16. The method of claim 11, wherein:
    the target processing layer includes a material layer which exhibits a degraded property in a resistance, a crystalline structure, or a stress.

17. The method of claim 11, wherein:
    the target processing layer includes a variable resistance layer that exhibits different resistance states and can be switched between the different resistance states in response to a voltage or current.

18. The method of claim 12, wherein:
    the variable resistance layer includes a phase change material.

19. The method of claim 12, wherein:
    the variable resistance layer includes a metal oxide.

20. The method of claim 11, wherein the forming of the barrier layer includes reacting a silicon source gas and a source gas of one or more impurities.

* * * * *